(12) United States Patent
Tomiyasu et al.

(10) Patent No.: US 10,353,082 B2
(45) Date of Patent: Jul. 16, 2019

(54) IMAGING PANEL AND X-RAY IMAGING DEVICE

(71) Applicant: Sharp Kabushiki Kaisha, Osaka (JP)

(72) Inventors: Kazuhide Tomiyasu, Osaka (JP); Shigeyasu Mori, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 386 days.

(21) Appl. No.: 15/321,127

(22) PCT Filed: Jun. 22, 2015

(86) PCT No.: PCT/JP2015/067886
§ 371 (c)(1),
(2) Date: Dec. 21, 2016

(87) PCT Pub. No.: WO2016/002563
PCT Pub. Date: Jan. 7, 2016

(65) Prior Publication Data
US 2017/0139056 A1    May 18, 2017

(30) Foreign Application Priority Data
Jun. 30, 2014    (JP) .................. 2014-134724

(51) Int. Cl.
*G01T 1/20*    (2006.01)
*H01L 31/08*    (2006.01)
(Continued)

(52) U.S. Cl.
CPC .......... *G01T 1/20* (2013.01); *H01L 27/14612* (2013.01); *H01L 27/14636* (2013.01); *H01L 27/14663* (2013.01); *H01L 31/08* (2013.01); *H04N 5/32* (2013.01); *H04N 5/361* (2013.01); *H04N 5/369* (2013.01); *H04N 5/378* (2013.01)

(58) Field of Classification Search
CPC ................................ H04N 5/32; G01N 23/04
See application file for complete search history.

(56) References Cited

U.S. PATENT DOCUMENTS 9,250,334 B2 *   2/2016   Ryu ...................... G01T 1/2018
2004/0104351 A1   6/2004   Shibayama
(Continued)

FOREIGN PATENT DOCUMENTS

JP    2002-124676 A    4/2002
JP    2006-156555 A    6/2006
(Continued)

OTHER PUBLICATIONS

U.S. Appl. No. 15/320,682, filed Dec. 20, 2016.
(Continued)

*Primary Examiner* — Don K Wong
(74) *Attorney, Agent, or Firm* — ScienBiziP, P.C.

(57) ABSTRACT

A second insulating film is disposed so as to cover a conversion element that includes a first insulating film, photodiode, and electrode. The second insulating film is made of a $SiN_xO_y$ material, where x is greater than 0 and y is greater than or equal to 0. This makes it possible to provide a TFT and photodiode with excellent anti-moisture characteristics.

8 Claims, 8 Drawing Sheets

<A-A Cross Section>

(51) Int. Cl.
*H04N 5/32* (2006.01)
*H04N 5/369* (2011.01)
*H01L 27/146* (2006.01)
*H04N 5/361* (2011.01)
*H04N 5/378* (2011.01)

(56) References Cited

U.S. PATENT DOCUMENTS

| | | |
|---|---|---|
| 2009/0057564 A1 | 3/2009 | Miyayama et al. |
| 2009/0078877 A1 | 3/2009 | Yaegashi et al. |
| 2009/0250699 A1 | 10/2009 | Okada |
| 2011/0133095 A1 | 6/2011 | Imai |
| 2011/0186853 A1 | 8/2011 | Terai et al. |
| 2012/0313103 A1 | 12/2012 | Yamada et al. |
| 2013/0264485 A1 | 10/2013 | Kawanabe et al. |
| 2013/0299711 A1 | 11/2013 | Mochizuki et al. |
| 2013/0307041 A1 | 11/2013 | Mochizuki et al. |
| 2014/0103347 A1 | 4/2014 | Ishino |
| 2017/0131413 A1 | 5/2017 | Tomiyasu et al. |
| 2017/0148843 A1 | 5/2017 | Mori et al. |
| 2017/0154914 A1 | 6/2017 | Tomiyasu et al. |
| 2017/0154915 A1 | 6/2017 | Tomiyasu et al. |
| 2017/0154916 A1 | 6/2017 | Mori et al. |
| 2017/0160403 A1 | 6/2017 | Tomiyasu et al. |

FOREIGN PATENT DOCUMENTS

| | | |
|---|---|---|
| JP | 2006-253481 A | 9/2006 |
| JP | 2007-103578 A | 4/2007 |
| JP | 2009-59975 A | 3/2009 |
| JP | 2009-94465 A | 4/2009 |
| JP | 2009-212120 A | 9/2009 |
| JP | 2009-252835 A | 10/2009 |
| JP | 2010-98329 A | 4/2010 |
| JP | 2011-124334 A | 6/2011 |
| JP | 2011-159908 A | 8/2011 |
| JP | 2013-16772 A | 1/2013 |
| JP | 2013-219067 A | 10/2013 |
| JP | 2013-235934 A | 11/2013 |
| JP | 2013-235935 A | 11/2013 |
| JP | 2014-78651 A | 5/2014 |

OTHER PUBLICATIONS

U.S. Appl. No. 15/321,129, filed Dec. 21, 2016.
U.S. Appl. No. 15/320,704, filed Dec. 20, 2016.
U.S. Appl. No. 15/321,132, filed Dec. 21, 2016.
U.S. Appl. No. 15/321,142, filed Dec. 21, 2016.
U.S. Appl. No. 15/320,712, filed Dec. 20, 2016.

* cited by examiner

<A-A Cross Section>

FIG. 4B

<B-B Cross Section>

<A-A Cross Section>   <B-B Cross Section>

FIG. 11

<A-A Cross Section>   <B-B Cross Section>

FIG. 12

<A-A Cross Section>

FIG. 13

<A-A Cross Section>

IMAGING PANEL AND X-RAY IMAGING DEVICE

TECHNICAL FIELD

The present invention relates to an imaging panel and an X-ray imaging device.

BACKGROUND ART

There are X-ray imaging devices that take X-ray images via an imaging panel having a plurality of pixels. In these types of X-ray imaging devices, photodiodes such as X-ray conversion films made of amorphous selenium (a-Se) convert the radiated X-rays into electric charge, for example. The electric charge that has been thus converted is read out by operating a thin film transistor (hereinafter, also "TFT") included in a pixel. Reading out the electric charge in this manner provides an X-ray image.

This type of X-ray imaging device is described in Patent Document 1, which discloses a photoelectric converter constituting an X-ray image detector. Patent Document 1 describes that, in this photoelectric converter, a photodiode element has a photoelectric conversion layer between a bottom electrode and top electrode, and the photoelectric conversion layer has a protective film formed smaller and more inside than the bottom electrode in a manner that covers at least the face of a pattern side wall of the photoelectric conversion layer.

RELATED ART DOCUMENT

Patent Document

Patent Document 1: Japanese Patent Application Laid-Open Publication No. 2014-78651

SUMMARY OF THE INVENTION

Problems to be Solved by the Invention

However, the photodiode, TFT, etc. are covered by a photosensitive resin layer containing moisture. Moisture in the photosensitive resin layer infiltrating the photodiode may cause leakage current in the photodiode and the occurrence of dark current. Furthermore, the moisture in the photosensitive resin layer infiltrating the TFT lowers the threshold characteristics of the TFT and can cause a reduction in the driving stability of the device.

The present invention aims at achieving stable driving and reducing dark current in an imaging panel and X-ray imaging device.

Means for Solving the Problems

An imaging panel of the present invention that solves the above-mentioned problems is an imaging panel for generating an image in accordance with scintillation light obtained from X-rays that have passed through a specimen, the imaging panel including: a substrate; a plurality of thin film transistors on the substrate; a first insulating film covering the thin film transistors; a plurality of conversion elements on the first insulating film that convert the scintillation light to electric charge; a second insulating film covering the plurality of conversion elements and the first insulating film; a photosensitive resin layer on the second insulating film; and a bias wiring line respectively connecting to the conversion elements and supplying a bias voltage to the conversion elements, wherein each of the thin film transistors includes: a gate electrode; a gate insulating film in a layer above or a layer below the gate electrode; a semiconductor active layer facing the gate electrode with the gate insulating film interposed between the semiconductor active layer and the gate electrode; a source electrode electrically connected to the semiconductor active layer; and a drain electrode electrically connected to the semiconductor active layer and separated from the source electrode, wherein the plurality of conversion elements each include: a first semiconductor layer electrically connected to the drain electrode via a first contact hole in the first insulating film; a second semiconductor layer over the first semiconductor layer and having a conductivity type that is opposite to the first semiconductor layer; and an electrode on the second semiconductor layer connected to the bias wiring line via a second contact hole in the photosensitive resin layer, and wherein the second insulating film is made of a $SiN_xO_y$ material, where x is greater than 0, and y is greater than or equal to 0.

Effects of the Invention

The present invention makes it possible to achieve stable driving and to reduce dark current in an imaging panel and X-ray imaging device.

DETAILED DESCRIPTION OF EMBODIMENTS

An imaging panel of one embodiment of the present invention is an imaging panel for generating an image in accordance with scintillation light obtained from X-rays that have passed through a specimen, the imaging panel including: a substrate; a plurality of thin film transistors on the substrate; a first insulating film covering the thin film transistors; a plurality of conversion elements on the first insulating film that convert the scintillation light to electric charge; a second insulating film covering the plurality of conversion elements and the first insulating film; a photosensitive resin layer on the second insulating film; and a bias wiring line respectively connecting to the conversion elements and supplying a bias voltage to the conversion elements, wherein each of the thin film transistors includes: a gate electrode; a gate insulating film in a layer above or a layer below the gate electrode; a semiconductor active layer facing the gate electrode with the gate insulating film interposed between the semiconductor active layer and the gate electrode; a source electrode electrically connected to the semiconductor active layer; and a drain electrode electrically connected to the semiconductor active layer and separated from the source electrode, wherein the plurality of conversion elements each include: a first semiconductor layer electrically connected to the drain electrode via a first contact hole in the first insulating film; a second semiconductor layer over the first semiconductor layer and having a conductivity type that is opposite to the first semiconductor layer conductivity type; and an electrode on the second semiconductor layer connected to the bias wiring line via a second contact hole in the photosensitive resin layer, and wherein the second insulating film is made of a $SiN_xO_y$ material, where x is greater than 0, and y is greater than or equal to 0.

According to the first configuration, the TFT is covered via the first insulating film by the second insulating film, which is made of a $SiN_xO_y$ material, where x is greater than 0 and y is greater than or equal to 0; thus, it is possible to provide excellent anti-moisture performance to the TFT. Therefore, it is possible to provide a TFT having excellent threshold characteristics. Furthermore, according to the configuration described above, the conversion element is covered by the second insulating film, which is made of the $SiN_xO_y$ material, where x is greater than 0 and y is greater than or equal to 0; thus, it is also possible to provide excellent anti-moisture performance to the conversion element. This inhibits leakage current and thus enables a reduction in the occurrence of dark current. Accordingly, the configuration described above makes it possible to provide an imaging panel that has stable driving and reduced dark current.

A second configuration is the first configuration, in which it is preferable that, with respect to the $SiN_xO_y$ material forming the second insulating film, x be greater than y.

A third configuration is the second configuration, in which it is even more preferable that, with respect to the $SiN_xO_y$ material forming the second insulating film, y be greater than 0.

A fourth configuration is any one of the first to third configurations, in which the photosensitive resin layer may be made of an organic photosensitive resin. When the photosensitive resin layer is made of an organic photosensitive resin, the amount of moisture in the photosensitive resin layer increases, but even in such a case, the second insulating film is made of a $SiN_xO_y$ material, where x is greater than 0 and y is greater than or equal to 0, and thus it is possible to provide excellent anti-moisture performance to the TFT and conversion element.

A fifth configuration is any one of the first to fourth configurations, in which the gate insulating film may be in a layer above the gate electrode.

A sixth configuration is the fifth configuration, in which the configuration may further include an etch-stop layer on the semiconductor active layer.

A seventh configuration is any one of the first to fourth configurations, in which the gate insulating film may be in a layer below the gate electrode.

An X-ray imaging device of one embodiment of the present invention includes: the imaging panel according to any one of the first to seventh configurations; a controller controlling respective gate voltages of the plurality of thin film transistors and reading out data signals that correspond to electric charge converted by the conversion elements; an X-ray light source radiating X-rays; and a scintillator converting the X-rays to scintillation light (eighth configuration).

Embodiments of the present invention will be described in detail below with reference to the drawings. Portions in the drawings that are the same or similar are assigned the same reference characters and descriptions thereof will not be repeated.

Configuration

Figure 1:
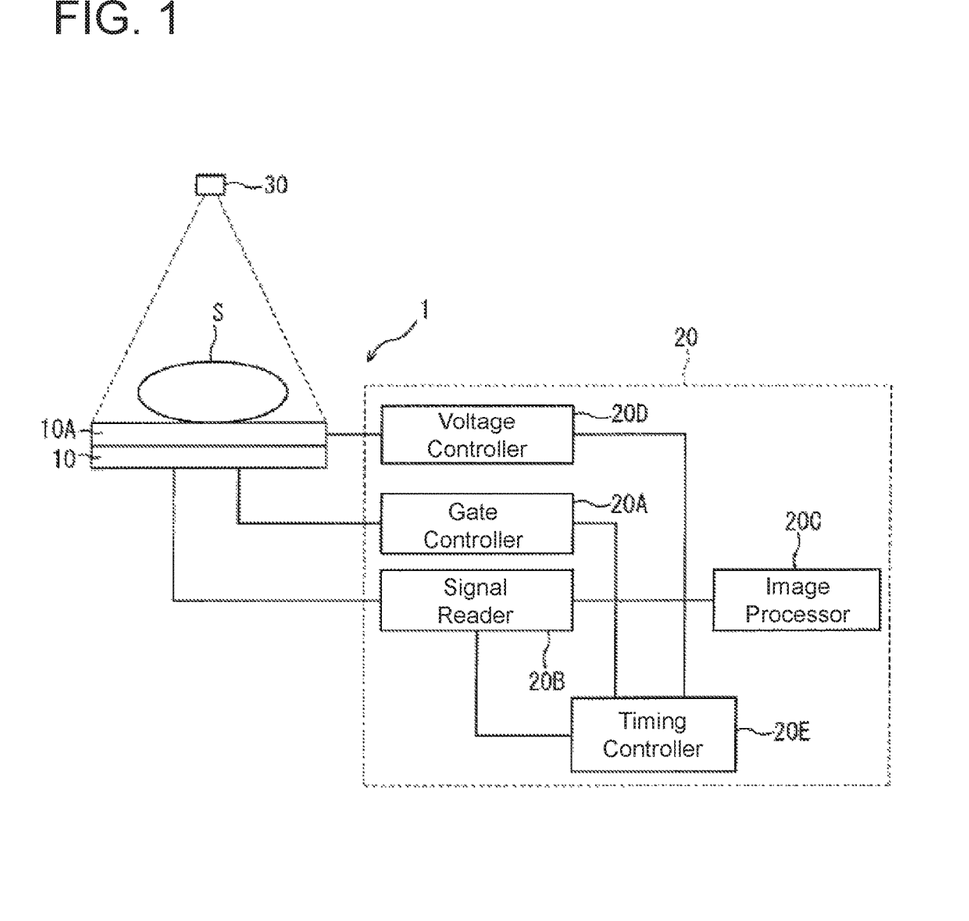
FIG. 1 is a schematic diagram showing an X-ray imaging device of an embodiment.

FIG. 1 is a schematic diagram showing an X-ray imaging device of an embodiment. An X-ray imaging device 1 includes an imaging panel 10 and a controller 20. X-rays from the X-ray source 30 irradiate a specimen S, and the X-rays that have passed through the specimen S are converted to fluorescent light (hereinafter, scintillator light) by the scintillator 10A at the top of the imaging panel 10. The X-ray imaging device 1 captures X-ray images by the scintillator light being imaged by the imaging panel 10 and the controller 20.

Figure 2:
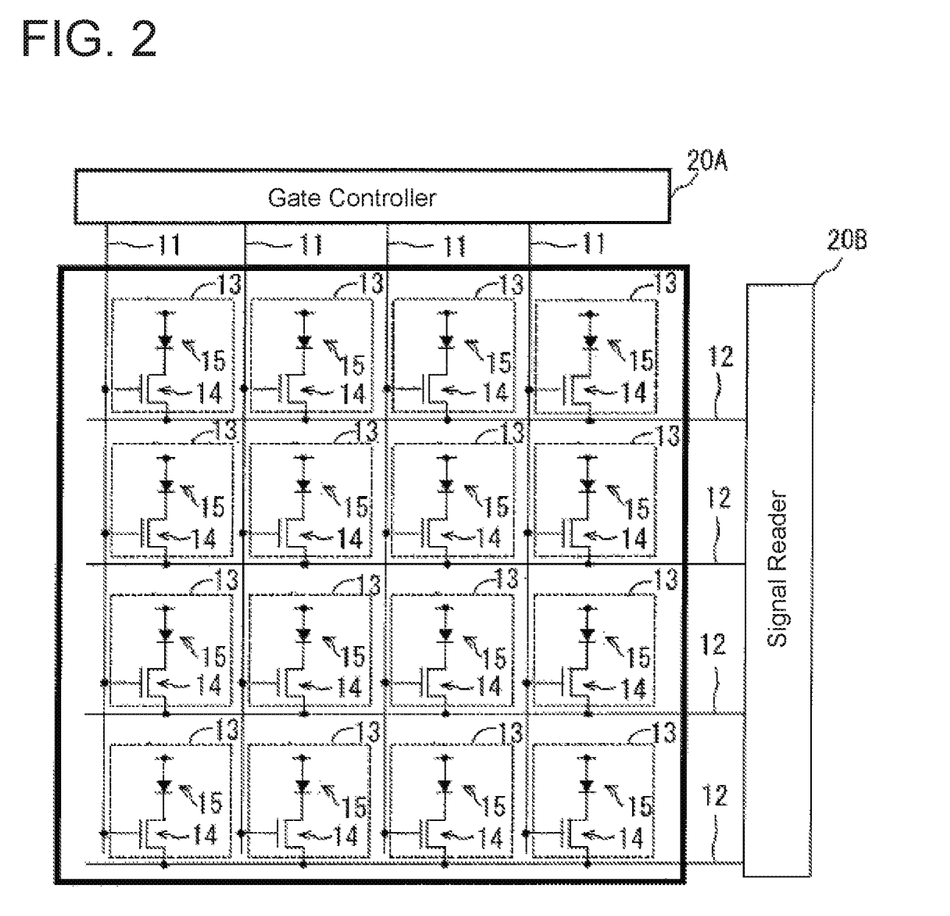
FIG. 2 is a schematic diagram showing a general configuration of the imaging panel in FIG. 1.

FIG. 2 is a schematic diagram showing a general configuration of the imaging panel 10. As shown in FIG. 2, a plurality of gate lines 11 and a plurality of data lines 12 intersecting the plurality of gate lines 11 are formed on the imaging panel 10. The imaging panel 10 has a plurality of pixels 13 defined by the gate lines 11 and data lines 12. FIG. 2 shows an example that has 16 (four rows and four columns) pixels 13, but the number of pixels in the imaging panel 10 is not limited to this.

Each of the pixels 13 has a TFT 14 connected to the gate line 11 and data line 12, and a photodiode 15 connected to the TFT 14. Furthermore, while not shown in FIG. 2, each of the pixels 13 has a bias line 16 (see FIG. 3) that supplies bias voltage to the photodiode 15, and this bias line is disposed roughly parallel to the data line 12.

In each of the pixels 13, the scintillation light, or namely the converted X-rays that have passed through the specimen S, is converted by the photodiode 15 into an electric charge that corresponds to the intensity of the scintillation light.

Each of the gate lines 11 in the imaging panel 10 is switched to a sequentially selectable state by the gate controller 20A, and the TFT 14 connected to the gate line 11 in the selected state turns ON. When the TFT 14 turns ON, a data signal corresponding to the electric charge converted by the photodiode 15 is output via the data line 12.

Figure 3:
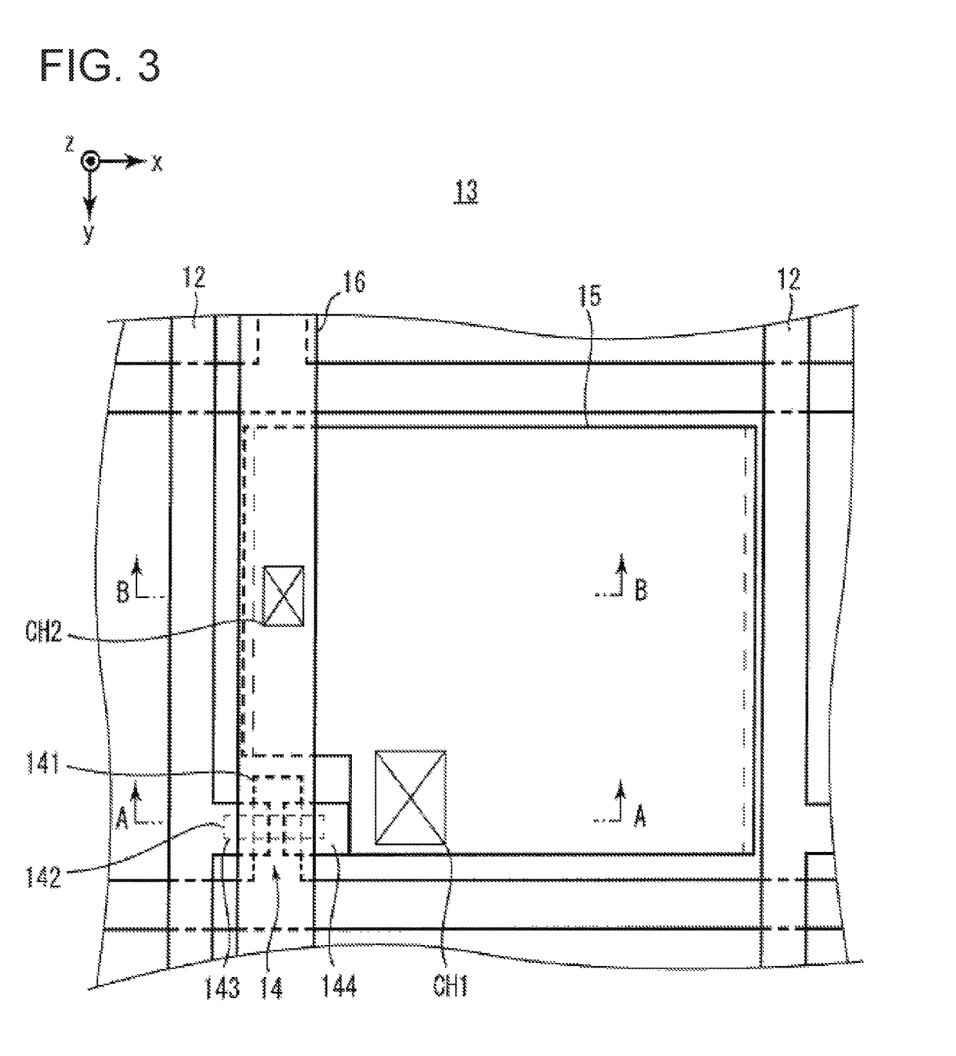
FIG. 3 is a plan view of a pixel from the imaging panel in FIG. 2.
Figure 4A:
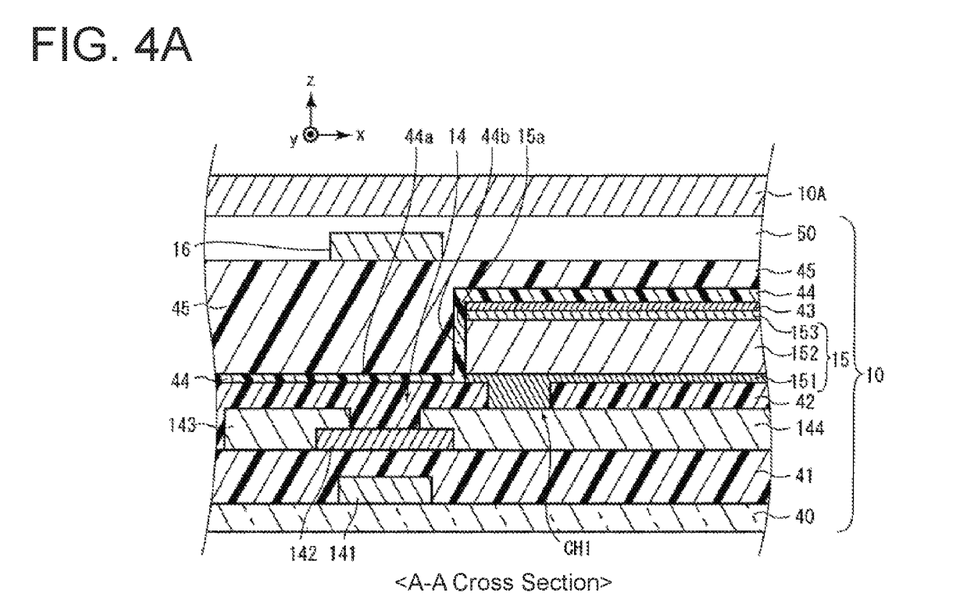
FIG. 4A is a cross-sectional view of FIG. 3 along the line A-A.

Next, a specific configuration of the pixel 13 will be described. FIG. 3 is a plan view of the pixel 13 from the imaging panel 10 shown in FIG. 2. FIG. 4A is a cross-sectional view of the pixel 13 shown in FIG. 3 along the line A-A, and FIG. 4B is a cross-sectional view of the pixel 13 shown in FIG. 3 along the line B-B.

Figure 4B:
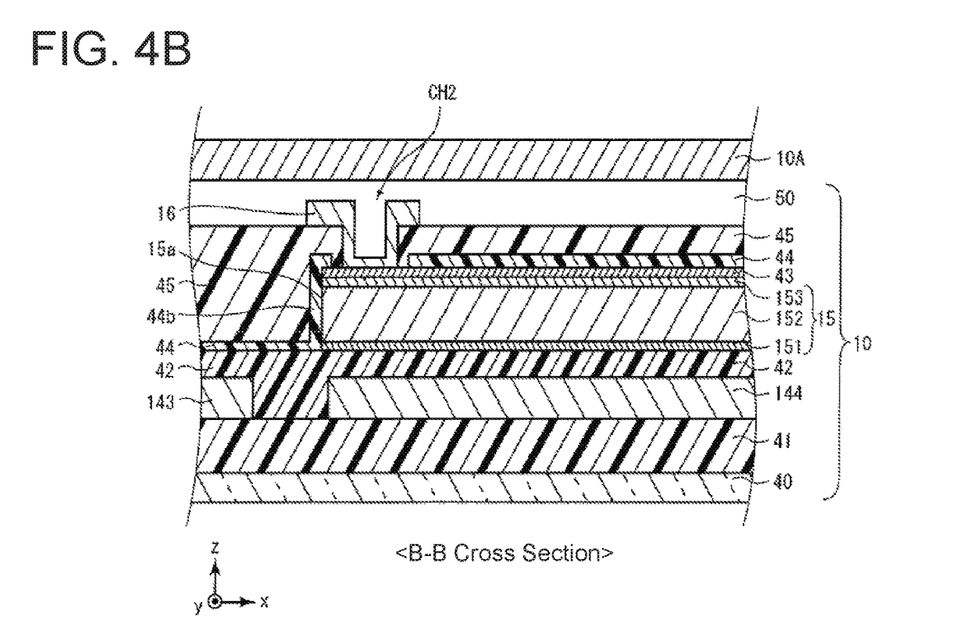
FIG. 4B is a cross-sectional view of FIG. 3 along the line B-B.

As shown in FIG. 4A and FIG. 4B, the pixel 13 is formed on a substrate 40. The substrate 40 is an insulating substrate such as a glass substrate, silicon substrate, a heat-resistant plastic substrate, a resin substrate, or the like, for example. In particular, for a plastic substrate or resin substrate, polyethyleneterephthalate (PET), polyethylene naphthalate (PEN), polyethersulfone (PES), acrylic, polyimide, or the like may be used.

The TFT 14 includes a gate electrode 141, a semiconductor active layer 142 disposed on the gate electrode 141 with a gate insulating film 41 therebetween, and a source electrode 143 and drain electrode 144 connected to the semiconductor active layer 142.

The gate electrode 141 is formed contacting one surface (hereinafter, main surface) of the substrate 40 in the thickness direction. The gate electrode 141 is made of a metal such as aluminum (Al), tungsten (W), molybdenum (Mo), tantalum (Ta), chromium (Cr), titanium (Ti), or copper (Cu), or are an alloy of these metals or a metal nitride of these, for example. Alternatively, the gate electrode 141 may be a plurality of metal films layered together, for example. In the present embodiment, the gate electrode 141 has a multilayer structure in which an aluminum metal film and titanium metal film are layered together in this order.

As shown in FIG. 4A, the gate insulating film 41 is formed on the substrate 40 and covers the gate electrode 141. The gate insulating film 41 may be silicon oxide ($SiO_x$), silicon nitride ($SiN_x$), silicon oxynitride ($SiO_xN_y$) ($x>y$), silicon nitrogen oxide ($SiN_xO_y$) ($x>y$), or the like, for example.

In order to prevent diffusion of impurities or the like from the substrate 40, the gate insulating film 41 may be a multilayer structure. For example, the lower layer may be silicon nitride ($SiN_x$), silicon nitrogen oxide ($SiN_xO_y$) ($x>y$), etc., and the upper layer may be silicon oxide ($SiO_x$), silicon oxynitride ($SiO_xN_y$) ($x>y$), etc. Moreover, in order to form a compact gate insulating film that has little gate leakage current at low formation temperatures, a noble gas such as Argon may be included in the reactive gas so as to be mixed into the insulating film. In the present embodiment, the gate insulating film 41 has a multilayer structure in which the bottom layer is a 100 nm to 400 nm silicon nitride film formed with a reactant gas of $SiH_4$ and $NH_3$, and the upper layer is a 50 nm to 100 nm silicon oxide film.

As shown in FIG. 4A, the semiconductor active layer 142 is formed contacting the gate insulating film 41. The semiconductor active layer 142 is an oxide semiconductor layer. The oxide semiconductor may be an amorphous oxide semiconductor or the like containing $InGaO_3(ZnO)_5$, magnesium zinc oxide ($Mg_xZn_{1-x}O$), cadmium zinc oxide ($Cd_xZn_{1-x}O$), cadmium oxide (CdO), or containing prescribed proportions of indium (In), gallium (Ga), and zinc (Zn), for example. The semiconductor active layer 142 may be a ZnO non-crystalline (amorphous) material doped with one or more impurity elements selected among group 1 elements, group 13 elements, group 14 elements, group 15 elements, group 17 elements, and the like, or a polycrystalline material. Alternatively, the semiconductor active layer may be a microcrystalline material (a mix of amorphous and polycrystalline states), or a material that has had no impurities added.

As shown in FIGS. 4A and 4B, the source electrode 143 and drain electrode 144 are formed contacting the semiconductor active layer 142 and gate insulating film 41. As shown in FIG. 3, the source electrode 143 is connected to the data line 12. As shown in FIG. 4A, the drain electrode 144 is connected to the photodiode 15 via a first contact hole CH1. The source electrode 143, the data line 12, and the drain electrode 144 are formed on the same layer.

The source electrode 143, data line 12, and drain electrode 144 are made of a metal such as aluminum (Al), tungsten (W), molybdenum (Mo), tantalum (Ta), chromium (Cr), titanium (Ti), or copper (Cu), or are an alloy of these metals or a metal nitride of these, for example. Alternatively, the source electrode 143, data line 12, and drain electrode 144 may be a transmissive material such as indium tin oxide (ITO), indium zinc oxide (IZO), indium tin oxide containing silicon oxide (ITSO), indium oxide ($In_2O_3$), tin oxide ($SnO_2$), zinc oxide (ZnO), titanium nitride, or the like, or may be a combination of these.

The source electrode 143, data line 12, and drain electrode 144 may be a plurality of metal films layered together, for example. In the present embodiment, the source electrode 143, data line 12, and drain electrode 144 have a multilayer structure in which a titanium metal film, aluminum metal film, and titanium metal film are layered together in this order.

As shown in FIGS. 4A and 4B, the first interlayer insulating film 42 covers the semiconductor active layer 142, source electrode 143, data line 12, and drain electrode 144. The first interlayer insulating film 42 may be a single layer structure made of silicon oxide ($SiO_2$) or silicon nitride (SiN), or a multilayer structure in which silicon nitride (SiN) and silicon oxide ($SiO_2$) are layered together in this order.

As shown in FIG. 4A and FIG. 4B, the photodiode 15 is formed on the first interlayer insulating film 42 contacting the drain electrode 144. The photodiode 15 includes at least a first semiconductor layer having a first conductivity type, and a second semiconductor layer having a second conductivity type that is opposite to the first conductivity type. In the present embodiment, the photodiode 15 includes an n-type amorphous silicon layer 151 (first conductivity type), an intrinsic amorphous silicon layer 152, and a p-type amorphous silicon layer 153 (second semiconductor layer).

The n-type amorphous silicon layer 151 is made of amorphous silicon that has been doped by an n-type impurity (phosphorous, for example). The n-type amorphous silicon layer 151 is formed contacting the drain electrode 144. The thickness of the n-type amorphous silicon layer 151 is 20 nm to 100 nm, for example.

The intrinsic amorphous silicon layer 152 is made of intrinsic amorphous silicon. The intrinsic amorphous silicon layer 152 is formed contacting the n-type amorphous silicon layer 151. The thickness of the intrinsic amorphous silicon layer is 200 nm to 2000 nm, for example.

The p-type amorphous silicon layer 153 is made of amorphous silicon that has been doped by a p-type impurity (boron, for example). The p-type amorphous silicon layer 153 is formed contacting the intrinsic amorphous silicon layer 152. The thickness of the p-type amorphous silicon layer 153 is 10 nm to 50 nm, for example.

The drain electrode 144 functions as the drain electrode of the TFT 14 and the bottom electrode of the photodiode 15. Furthermore, the drain electrode 144 also functions as a reflective film that reflects the scintillation light that has passed through the photodiode 15 back towards the photodiode 15.

As shown in FIG. 4A and FIG. 4B, an electrode 43 is formed on top of the photodiode 15 and functions as the top electrode of the photodiode 15. The electrode 43 is made of indium zinc oxide (IZO), for example.

The second interlayer insulating film 44 is formed contacting the first interlayer insulating film 42 and electrode 43. Specifically, as shown in FIG. 4A, the second interlayer insulating film 44 covers the first interlayer insulating film 42 in a layer above the TFT 14. Thus, a portion 44a of the second interlayer insulating film is between the TFT 14 and the photosensitive resin layer 45. As shown in FIGS. 4A and 4B, the second interlayer insulating film 44 covers a side face 15a of the photodiode 15. Thus, a portion 44b of the second interlayer insulating film is between the side face 15a of the photodiode 15 and the photosensitive resin layer 45.

The second interlayer insulating film 44 includes a film containing a $SiN_xO_y$ material. Here, x is greater than 0, and y is greater than or equal to 0. The x and y values in the $SiN_xO_y$ film are preferably x>y, for better anti-moisture performance. Moreover, for better anti-moisture performance, it is most preferable that the second interlayer insulating film 44 be a silicon nitride film. In other words, the second interlayer insulating film 44 may be a silicon film containing nitrogen atoms.

Specifically, the film constituting the second interlayer insulating film 44 may be a silicon nitride film such as a SiN film, $Si_3N_4$ film, etc. Moreover, the film constituting the second interlayer insulating film 44 may be a $SiN_xO_y$ film (silicon nitride oxide film) (but where x>0 and y>0). If the amount of nitrogen atoms in the $SiN_xO_y$ is greater than the amount of oxygen atoms, then the $SiN_xO_y$ film may also be expressed as $SiO_yN_x$ (silicon oxynitride film) (but where x>0 and y>0). Specifically, examples of the silicon nitride oxide film constituting the second interlayer insulating film 44 include SiNO, SiON, $SiO_5N_3$, etc.

The second interlayer insulating film 44 can be a single layer or two or more layers. If the second interlayer insulating film 44 has a multilayer structure of two or more layers, then the silicon nitride film and silicon nitride oxide film may be layered together, or alternatively two types of silicon nitride oxide films with different x/y ratios may be layered together. Furthermore, if the second interlayer insulating film 44 has a multilayer structure of two or more layers, then the silicon nitride film and silicon oxide film may be layered together. In such a case, in order to inhibit the infiltration of moisture from the photosensitive resin layer 45, it is preferable that the silicon oxide film be formed on the bottom layer and the silicon nitride film be formed on the top layer thereabove. Furthermore, in a similar manner, if the second interlayer insulating film 44 has a multilayer structure of two or more layers, then the silicon nitride oxide film and the silicon oxide film may be layered together. In such a case, in order to inhibit the infiltration of moisture from the photosensitive resin layer 45, it is preferable that the silicon oxide film be formed on the bottom layer and the silicon nitride oxide film be formed on the top layer thereabove.

The second interlayer insulating film 44 has a thickness of 50 nm to 200 nm, for example.

The photosensitive resin layer 45 is formed on top of the second interlayer insulating film 44. The photosensitive resin layer 45 is made of an organic resin material or an inorganic resin material.

As shown in FIGS. 3, 4A, and 4B, the bias wiring line 16 is formed on the photosensitive resin layer 45 substantially parallel to the data line 12. Specifically, as shown in FIGS. 4A and 4B, the bias wiring line 16 is formed on top of the photosensitive resin layer 45 so as to overlap the TFT 14 and be near an edge portion of the photodiode 15 near the data line 12. The bias wiring line 16 is connected to a voltage controller 20D (see FIG. 1). Furthermore, as shown in FIG. 4B, the bias wiring line 16 is connected to the electrode 43 via a second contact hole CH2 and applies a bias voltage received from the voltage controller 20D to the electrode 43. The bias wiring line 16 has a multilayer structure in which indium zinc oxide (IZO) and molybdenum (Mo) are layered together, for example.

As shown in FIGS. 4A and 4B, a protective layer 50 is formed on top of the imaging panel 10, or namely on top of the photosensitive resin layer 45, so as to cover the bias wiring line 16, and the scintillator 10A is disposed on top of the protective layer 50.

The configuration of the controller 20 will be explained while referring back to FIG. 1. The controller 20 includes a gate controller 20A, signal reader 20B, image processor 20C, voltage controller 20D, and timing controller 20E.

As shown in FIG. 2, the gate controller 20A is connected to a plurality of the gate lines 11. The gate controller 20A applies, via the gate lines 11, a prescribed gate voltage to the TFTs 14 of the pixels 13 connected to the gate lines 11.

As shown in FIG. 2, the signal reader 20B is connected to the plurality of data lines 12. The signal reader 20B, via the respective data lines 12, reads out data signals that correspond to the electric charge converted by the photodiode 15 of the pixel 13. The signal reader 20B generates image signals based on the data signals and outputs the result to the image processor 20C.

The image processor 20C generates X-ray images based on the image signals output from the signal reader 20B.

The voltage controller 20D is connected to the bias wiring line 16. The voltage controller 20D applies a prescribed bias voltage to the bias wiring line 16. This applies a bias voltage to the photodiode 15 via the electrode 43 connected to the bias wiring line 16.

The timing controller 20E controls the operation timing of the gate controller 20A, signal reader 20B, and voltage controller 20D.

The gate controller 20A selects one gate line 11 from the plurality of gate lines 11 based on the control signal from the timing controller 20E. The gate controller 20A applies, via the selected gate line 11, a prescribed gate voltage to the TFT 14 of the pixel 13 connected to the corresponding gate line 11.

The signal reader 20B selects one data line 12 from the plurality of data lines 12 based on the control signal from the timing controller 20E. The signal reader 20B, via the selected data line 12, reads out the data signal corresponding to the electric charge converted by the photodiode 15 of the pixel 13. The pixel 13 where the data signal has been read out is connected to the data line 12 selected by the signal reader 20B and connected to the gate line 11 selected by the gate controller 20A.

When irradiated by X-rays from the X-ray source 30, the timing controller 20E outputs a control signal to the voltage controller 20D, for example. Based on this control signal, the voltage controller 20D applies a prescribed bias voltage to the electrode 43.

Operation of X-ray Imaging Device 10

First, X-rays are radiated from the X-ray source 30. At such time, the timing controller 20E outputs a control signal to the voltage controller 20D. Specifically, a signal indicating that X-rays have been radiated from the X-ray source 30 is output from a controller that controls operation of the X-ray light source 30 to the timing controller 20E, for example. When this signal has been received by the timing controller 20E, the timing controller 20E outputs a control signal to the voltage controller 20D. The voltage controller 20D applies a prescribed voltage (bias voltage) to the bias wiring line 16 based on the control signal from the timing controller 20E.

The X-rays radiated from the X-ray source 30 pass through the specimen S and enter the scintillator 10A. The X-rays that have entered the scintillator 10A are converted into fluorescent light (scintillation light), and the scintillation light enters the imaging panel 10.

When the scintillation light enters the photodiode 15 disposed in the respective pixels 13 in the imaging panel 10, the photodiode 15 converts the scintillation light into an electric charge that corresponds to the intensity of the scintillation light.

The data signal that corresponds to the electric charge converted by the photodiode 15 passes through the data line 12 and is read out by the signal reader 20B when a gate voltage (plus voltage) received from the gate controller 20A via the gate line 11 turns ON the TFT 14. An X-ray image that corresponds to the read-out data signal is generated by the image processor 20C.

Manufacturing Method of Imaging Panel 10

Next, a method of manufacturing the imaging panel 10 will be explained. FIGS. 5 to 11 are cross-sectional views of the pixel 13 along lines A-A and B-B during each manufacturing step of the imaging panel 10.

Figure 5:
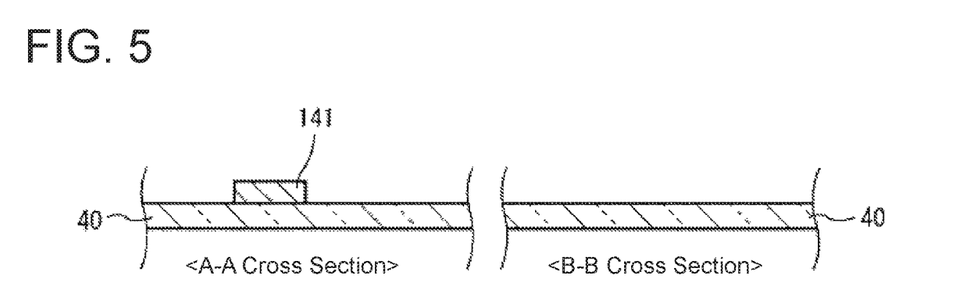
FIG. 5 is a cross-sectional view of a pixel in the manufacturing process of the gate electrode along the line A-A and along the line B-B.

As shown in FIG. 5, sputtering or the like is used to form an aluminum/titanium layered metal film on the substrate 40. Then, photolithography is used to pattern this metal film to form the gate electrode 141 and gate line 11. The thickness of the metal film is 300 nm, for example.

Figure 6:
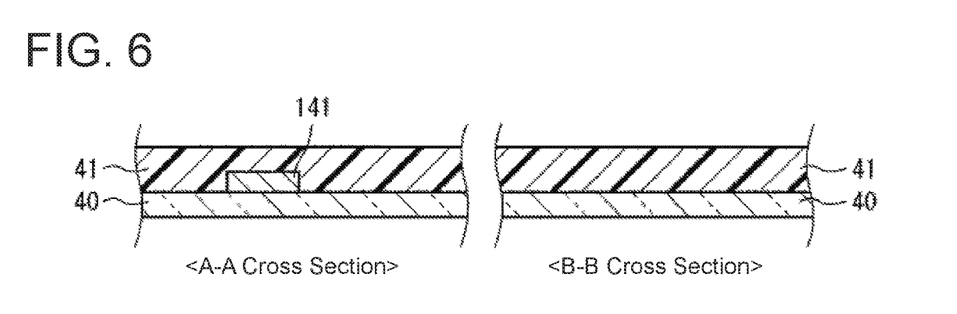
FIG. 6 is a cross-sectional view during a manufacturing process of a gate insulating film of the pixel shown in FIG. 3 along the line A-A and along the line B-B.

Next, as shown in FIG. 6, plasma-enhanced CVD, sputtering, or the like is used to form the silicon oxide ($SiO_x$) or silicon nitride ($SiN_x$) etc. gate insulating film 41 on the substrate 40 so as to cover the gate electrode 141. The thickness of the gate insulating film 41 is approximately 20 nm to 150 nm, for example.

Figure 7:
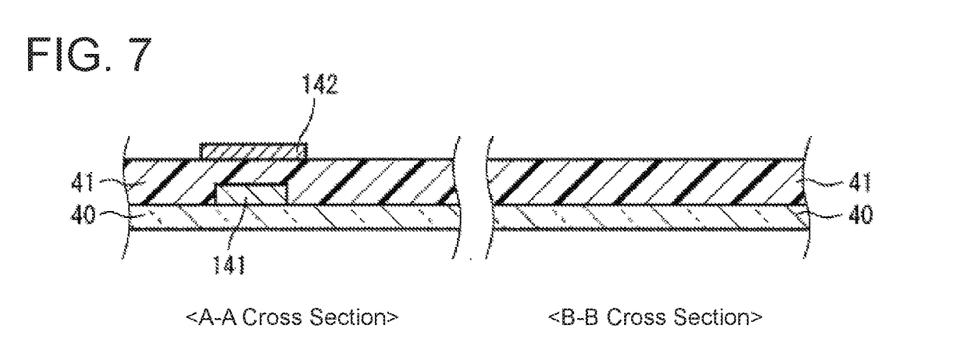
FIG. 7 is a cross-sectional view during a manufacturing process of a semiconductor active layer of the pixel shown in FIG. 3 along the line A-A and along the line B-B.

Next, as shown in FIG. 7, an oxide semiconductor is formed by sputtering or the like on the gate insulating film 41, and photolithography is used to pattern the oxide semiconductor to form the semiconductor active layer 142, for example. After the semiconductor active layer 142 has been formed, a high-temperature heat treatment (350° C. or greater, for example) may be performed in an environment containing oxygen (e.g., the atmosphere). In such a case, it is possible to reduce oxygen defects in the semiconductor active layer 142. The thickness of the semiconductor active layer 142 is 30 nm to 100 nm, for example.

Figure 8:
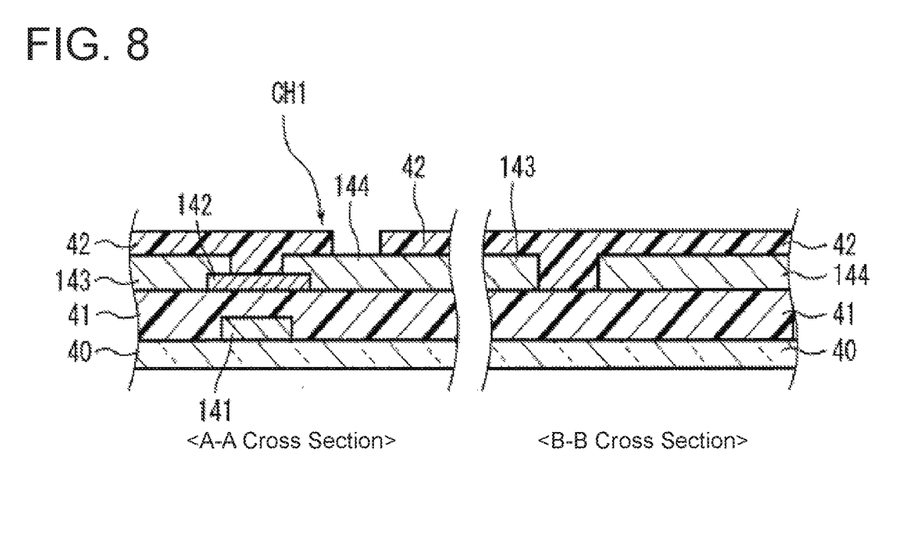
FIG. 8 is a cross-sectional view during a manufacturing process of a source electrode and a drain electrode of the pixel shown in FIG. 3 along the line A-A and along the line B-B.

Next, as shown in FIG. 8, sputtering or the like is used to form a metal film in which titanium, aluminum, and titanium are layered on this order on the gate insulating film 41 and the semiconductor active layer 142. Then, photolithography is used to pattern this metal film to form the source electrode 143, data line 12, and drain electrode 144. The thickness of the source electrode 143, data line 12, and drain electrode 144 is approximately 50 nm to 500 nm, for example. The etching may be either dry etching or wet etching, with dry etching being suitable if the area of the substrate 40 is large. This forms a bottom-gate TFT 14.

Next, plasma-enhanced CVD is used to form the silicon oxide ($SiO_2$) or silicon nitride (SiN) first interlayer insulating film 42 on the source electrode 143, data line 12, and drain electrode 144, for example. Thereafter, a thermal treatment of approximately 350° C. is performed on the entire surface of the substrate 40, and photolithography is used to pattern the first interlayer insulating film 42 and form the contact hole CH1.

Figure 9:
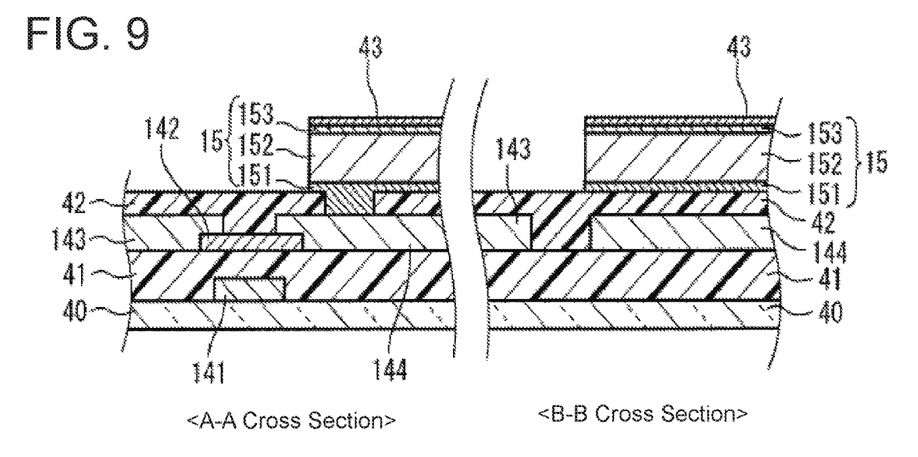
FIG. 9 is a cross-sectional view during a manufacturing process of a photodiode of the pixel shown in FIG. 3 along the line A-A and along the line B-B.

Next, as shown in FIG. 9, sputtering or the like is used to form the n-type amorphous silicon layer 151, intrinsic amorphous silicon layer 152, and p-type amorphous silicon layer 153 in this order on the first interlayer insulating film 42 and drain electrode 144. At such time, the drain electrode 144 and the n-type amorphous silicon layer 151 are connected together via the first contact hole CH1. Thereafter, photolithography is used for patterning, and dry etching is performed to form the photodiode 15.

Next, sputtering or the like is used to deposit indium zinc oxide (IZO) on the first interlayer insulating film 42 and photodiode 15, which is patterned by photolithography to form the electrode 43.

Figure 10:
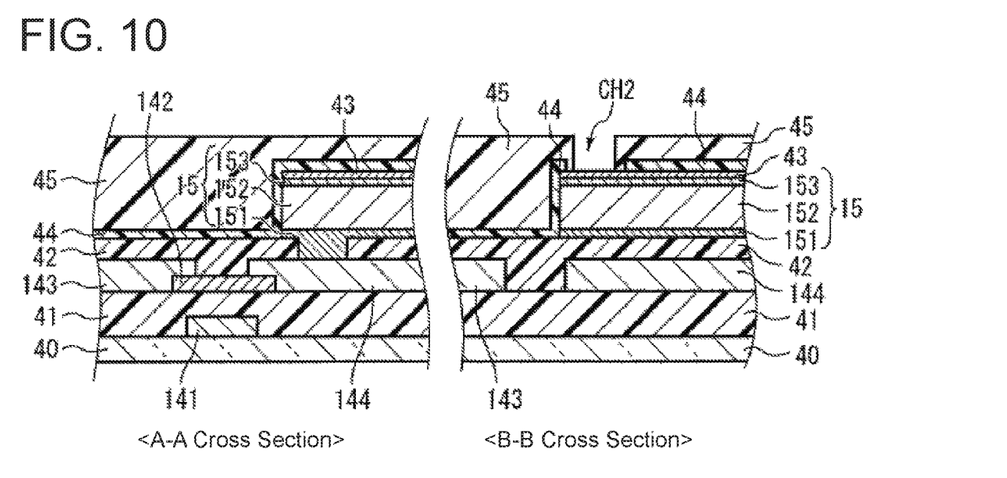
FIG. 10 is a cross-sectional view during a manufacturing process of a second interlayer insulating film of the pixel shown in FIG. 3 along the line A-A and along the line B-B.

Next, as shown in FIG. 10, plasma-enhanced CVD or the like is used to deposit silicon oxide ($SiO_2$) or silicon nitride (SiN) on the first interlayer insulating film 42 and electrode 43 to form the second interlayer insulating film 44. Then, photolithography is used to pattern the second interlayer insulating film 44 and form the opening serving as the second contact hole CH2 on the electrode 43. Thereafter, a photosensitive resin is formed and dried on the second interlayer insulating film 44, and then photolithography is used for patterning to form the photosensitive resin layer 45. At such time, an opening corresponding to the opening in the second interlayer insulating film 44 is formed, and the second contact hole CH2 is formed.

Figure 11:
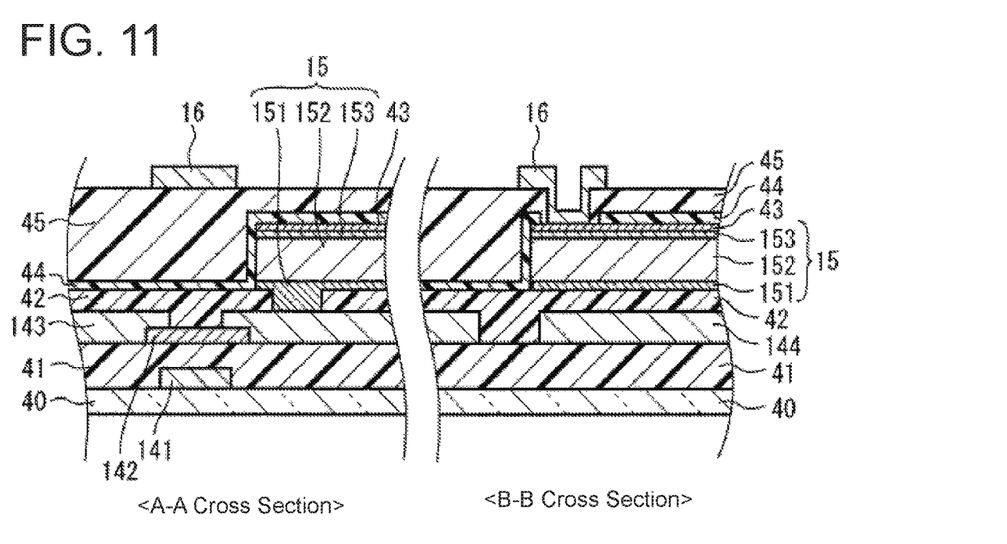
FIG. 11 is a cross-sectional view during a manufacturing process of a photosensitive resin layer and bias wiring line of the pixel shown in FIG. 3 along the line A-A and along the line B-B.

Next, as shown in FIG. 11, sputtering or the like is used to deposit a metal film in which indium tin oxide (IZO) and molybdenum (Mo) metal films are layered together on the photosensitive resin layer 45, and these are patterned by photolithography to form the bias wiring line 16.

According to the present embodiment, as shown in FIG. 4A, the second interlayer insulating film 44 covers the first interlayer insulating film 42 in a layer above the TFT 14. Thus, a portion 44a of the second interlayer insulating film is between the TFT 14 and the photosensitive resin layer 45. Accordingly, the present embodiment makes it possible to achieve anti-moisture performance for the TFT 14, and the TFT 14 retains excellent threshold characteristics. As a result, it is possible to provide an X-ray imaging device with stable driving.

Furthermore, according to the present embodiment, as shown in FIGS. 4A and 4B, the second interlayer insulating film 44 covers the side face 15a of the photodiode 15. Thus, a portion 44b of the second interlayer insulating film is between the side face 15a of the photodiode 15 and the photosensitive resin layer 45. This makes it possible to achieve excellent anti-moisture performance for the photodiode 15. This inhibits leakage current and thus enables a reduction in the occurrence of dark current.

Modification Examples

Next, modification examples of the present invention will be explained.

Figure 12:
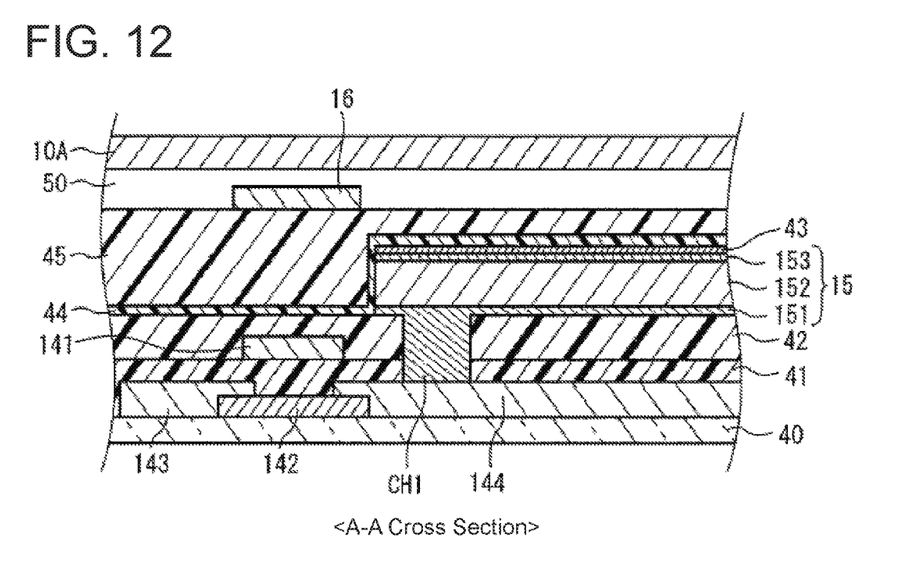
FIG. 12 is a cross-sectional view of a pixel of an imaging panel having a top-gate TFT according to a modification example.
Figure 13:
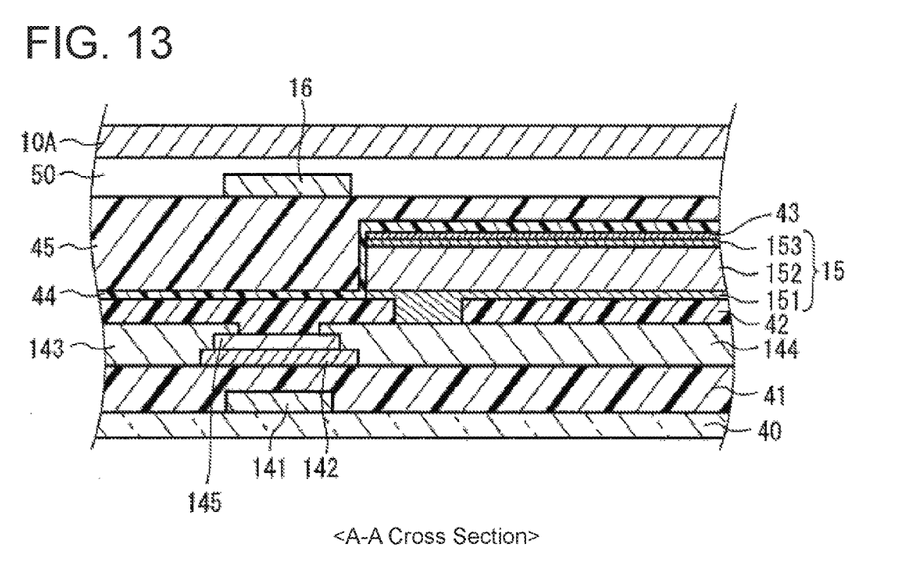
FIG. 13 is a cross-sectional view of a modification example of a pixel in the imaging panel including a TFT having an etch-stop layer.

In the embodiment described above, an example was described in which the bottom-gate TFT 14 is included in the imaging panel 10, but as shown in FIG. 12, the TFT 14 may be a top-gate TFT, or a bottom-gate TFT such as that shown in FIG. 13, for example.

The parts that differ from the embodiment described above for the method of manufacturing an imaging panel having the top-gate TFT 14 shown in FIG. 12 will be explained below. First, the semiconductor active layer 142 made of the oxide semiconductor is formed on the substrate 40. Thereafter, the source electrode 143, data line 12, and drain electrode 144, which are constituted by titanium, aluminum, and titanium layered in this order, are formed on the substrate 40 and semiconductor active layer 142.

Next, the silicon oxide ($SiO_x$) or silicon nitride ($SiN_x$) etc. gate insulating film 41 is formed on the semiconductor active layer 142, source electrode 143, data line 12, and drain electrode 144. Thereafter, the gate electrode 141 and gate line 11, which are constituted by aluminum and titanium layered together, are formed on the gate insulating film 41.

After the gate electrode 141 is formed, the first interlayer insulating film 42 is formed on the gate insulating film 41 so as to cover the gate electrode 141, and the first contact hole CH1 is formed penetrating through to the drain electrode 144. Then, in a similar manner to the embodiment described above, the photodiode 15 is formed on the first interlayer insulating film 42 and the drain electrode 144.

Furthermore, for an imaging panel equipped with TFTs 14 having an etch stop layer 145 as shown in FIG. 13, after the semiconductor active layer 142 is formed in the embodiment described above, plasma-enhanced CVD or the like is used to deposit silicon oxide ($SiO_2$) on the semiconductor active layer 142, for example. Thereafter, photolithography is used for patterning to form the etch stop layer 145. Then, after the etch stop layer 145 is formed, the source electrode 143, data line 12, and drain electrode 144, which are constituted by titanium, aluminum, and titanium layered together in this order, may be formed on the semiconductor active layer 142 and the etch stop layer 145.

An embodiment of the present invention has been described above, but the above embodiment is a mere example of an implementation of the present invention. Thus, the present invention is not limited to the embodiment described above, and can be implemented by appropriately modifying the embodiment described above without departing from the spirit of the present invention.

Industrial Applicability

The present invention is useful for imaging panels and X-ray imaging devices.

What is claimed is:

1. An imaging panel for generating an image in accordance with scintillation light obtained from X-rays that have passed through a specimen, the imaging panel comprising:
    a substrate;
    a plurality of thin film transistors on the substrate;
    a first insulating film covering the thin film transistors;
    a plurality of conversion elements on the first insulating film that convert the scintillation light to electric charge;
    a second insulating film covering the plurality of conversion elements and the first insulating film;
    a photosensitive resin layer on the second insulating film; and
    a bias wiring line respectively connecting to the conversion elements and supplying a bias voltage to the conversion elements,
    wherein each of the thin film transistors includes:
        a gate electrode;
        a gate insulating film in a layer above or a layer below the gate electrode;
        a semiconductor active layer facing the gate electrode with the gate insulating film interposed between the semiconductor active layer and the gate electrode;
        a source electrode electrically connected to the semiconductor active layer; and
        a drain electrode electrically connected to the semiconductor active layer and separated from the source electrode,
    wherein the plurality of conversion elements each include:
        a first semiconductor layer electrically connected to the drain electrode via a first contact hole in the first insulating film;
        a second semiconductor layer over the first semiconductor layer and having a conductivity type that is opposite to the first semiconductor layer; and
        an electrode on the second semiconductor layer connected to the bias wiring line via a second contact hole in the photosensitive resin layer, and
    wherein the second insulating film is made of a $SiN_xO_y$ material, where x is greater than 0, and y is greater than or equal to 0.

2. The imaging panel according to claim 1, wherein, with respect to the $SiN_xO_y$ material forming the second insulating film, x is greater than y.

3. The imaging panel according to claim 2, wherein, with respect to the $SiN_xO_y$ material forming the second insulating film, y is greater than 0.

4. The imaging panel according to claim 1, wherein the photosensitive resin layer is made of an organic photosensitive resin.

5. The imaging panel according to claim 1, wherein the gate insulating film is in a layer above the gate electrode.

6. The imaging panel according to claim 5, further comprising an etch-stop layer on the semiconductor active layer.

7. The imaging panel according to claim 1, wherein the gate insulating film is in a layer below the gate electrode.

8. An X-ray imaging device, comprising:
    the imaging panel according to claim 1;
    a controller controlling respective gate voltages of the plurality of thin film transistors and reading out data signals that correspond to electric charge converted by the conversion elements;
    an X-ray light source radiating X-rays; and
    a scintillator converting the X-rays to scintillation light.

* * * * *